United States Patent
Chuang et al.

(10) Patent No.: US 7,132,302 B2
(45) Date of Patent: Nov. 7, 2006

(54) METHOD OF INCREASING CELL RETENTION CAPACITY OF SILICON NITRIDE READ-ONLY-MEMORY CELL

(75) Inventors: Kuen-Chi Chuang, Tainan (TW);
Chen-Chin Liu, Hsinchu (TW);
Jiong-Zhong Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 246 days.

(21) Appl. No.: 10/709,603

(22) Filed: May 17, 2004

(65) Prior Publication Data
US 2005/0026309 A1  Feb. 3, 2005

(30) Foreign Application Priority Data
Jun. 27, 2003  (TW) .............................. 92117551 A

(51) Int. Cl.
*H01L 21/00*  (2006.01)
(52) U.S. Cl. ............................ 438/9; 438/14; 438/513; 257/E21.21; 257/E21.525
(58) Field of Classification Search .................... 438/9, 438/14, 513, 263, 264, 238, 381, 723, 745, 438/757, 706, 798
See application file for complete search history.

(56) References Cited

U.S. PATENT DOCUMENTS

| | | | | |
|---|---|---|---|---|
| 6,417,053 B1 * | 7/2002 | Kuo | ............................ | 438/287 |
| 6,469,342 B1 * | 10/2002 | Kuo et al. | .................... | 257/316 |
| 6,580,630 B1 * | 6/2003 | Liu et al. | .................... | 365/106 |
| 6,869,844 B1 * | 3/2005 | Liu et al. | .................... | 438/264 |
| 6,881,619 B1 * | 4/2005 | Lee et al. | ................... | 438/216 |

* cited by examiner

*Primary Examiner*—David Nhu
(74) *Attorney, Agent, or Firm*—Jiang Chyun LP Office

(57) ABSTRACT

A method of increasing the cell retention capacity of a silicon nitride read-only-memory on a wafer. The method includes carrying out a baking process after performing the last plasma treatment of the wafer but before a wafer sort test.

16 Claims, 4 Drawing Sheets

METHOD OF INCREASING CELL RETENTION CAPACITY OF SILICON NITRIDE READ-ONLY-MEMORY CELL

CROSS REFERENCE TO RELATED APPLICATIONS

This application claims the priority benefit of Taiwan application serial no. 92117551, filed Jun. 27, 2003.

BACKGROUND OF INVENTION

1. Field of Invention

The present invention relates to a method of fabricating memory. More particularly, the present invention relates to a method of increasing the data retention capacity of a silicon nitride read-only-memory cell.

2. Description of Related Art

Flash memory is a type of programmable/erasable non-volatile memory. Aside from power down data retention capacity, flash memory also has in-circuit electrical programming and erasing capability. Thus, flash memory is deployed as a non-volatile memory device inside most personal computers and electronic equipment.

Flash memory can be classified into two major types, including doped polysilicon floating gate read-only-memory and silicon nitride read-only-memory with the silicon nitride layer serving as a charge-trapping layer. The electrons for injecting into the silicon nitride charge trapping layer of the silicon nitride read-only-memory is concentrated within a localized region.

For a silicon nitride read-only-memory, data retention period in excess of ten years is often demanded besides the normal reliability requirements in all memory devices. Furthermore, the silicon nitride read-only-memory must operate normally after numerous programming and erasing operations. To meet such stringent conditions, the silicon nitride read-only-memory must undergo a cell retention check during a reliability test. In general, the cell retention check is carried out during a wafer sort test. The check includes heating the finished wafer product to a temperature of about 250° C. and maintaining at this temperature for a 24-hour period. During the check, a high voltage is applied to the memory to conduct data programming.

In the process of fabricating the silicon nitride read-only-memory, the two outermost word lines located on each side of the memory cell array are vulnerable to various types of in process damages, ultimately damaging the tunnel oxide layer. Moreover, some of the steps may require a plasma treatment leading to some holes trapped within the damaged tunnel oxide layer. In a convention fabrication process, the silicon nitride read-only-memory wafers are sorted after conducting a wafer acceptance test (WAT) and a quality control visual inspection. If the wafer is damaged so that the tunnel oxide layer contains trapped holes, these holes may induce the charges within the charge-trapping layer to leak into the substrate through the tunnel oxide layer during a cell retention check. Ultimately, there is a loss of charges leading to a lowering of memory retention capacity and threshold voltage.

SUMMARY OF INVENTION

Accordingly, one object of the present invention is to provide a method of increasing cell retention capacity of a silicon nitride read-only-memory cell by preventing charges leaking from the charge-trapping layer so that a constant threshold voltage can be maintained.

This invention also provides a method of increasing cell retention capacity of a silicon nitride read-only-memory such that the silicon-nitride read-only-memory is formed on a wafer. The method includes baking the wafer. The baking process is carried out after a final plasma treatment of the wafer but before wafer sorting.

Since the wafer is baked after the final plasma treatment of the wafer but before the wafer sorting, any holes trapped inside the tunnel oxide layer in each memory cell are removed.

Furthermore, with the removal of trapped holes within the tunnel oxide layer of the wafer, hole triggered loss of charges is prevented even if the wafer undergoes a cell retention check thereafter. Ultimately, charge retention capacity of the silicon nitride read-only-memory is effectively increased.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
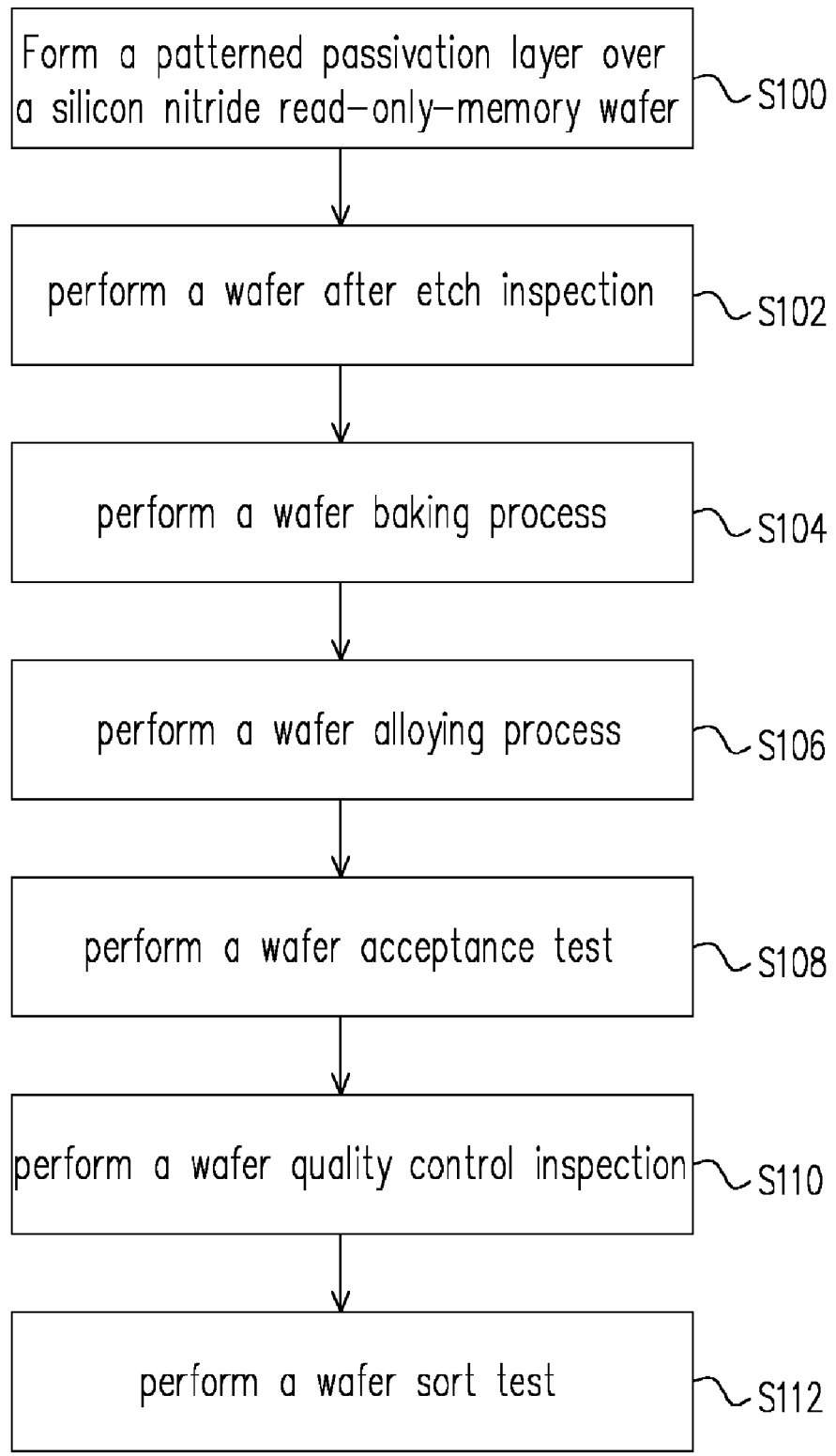
FIG. 1 is a flow chart showing the steps for increasing cell retention capacity of a silicon nitride read-only-memory cell according to a first preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a flow chart showing the steps for increasing cell retention capacity of a silicon nitride read-only-memory cell according to a first preferred embodiment of this invention. In step S100, a patterned passivation layer is formed over a silicon nitride read-only-memory wafer. The steps for forming the patterned passivation layer includes forming a passivation layer over the entire wafer, forming a patterned photoresist layer and removing a portion of the passivation layer using the photoresist layer as an etching mask. Thereafter, the photoresist layer is removed. The step for removing a portion of the passivation layer includes performing a plasma dry etching operation and the step for removing the photoresist layer includes performing a plasma dry etching operation and a solvent wet strip operation, for example.

In step S102, an after etch inspection (AEI) of the wafer is performed to check if the patterned passivation layer has the correct pattern.

In step S104, the wafer is baked to remove holes trapped within the tunnel oxide layer of the silicon nitride read-only memory. The baking process is carried out, for example, by placing the wafer inside a heating device filled with nitrogen gas, preset to a suitable temperature and heating the wafer for a pre-determined time period. In general, the temperature is set to a temperature between 170° C. to 300° C. and baked for a period between 8 to 24 hours.

In step S106, an alloying of the wafer is carried out so that the interfaces between the metallic materials within the silicon nitride read-only-memory has better properties. Furthermore, the interface defects of the tunnel oxide layer is repaired so that the quality of the tunnel oxide layer is improved.

In step S108, the wafer undergoes a wafer acceptance test (WAT) to find out the wafer yield of the wafer fabrication plant.

In step S110, a quality control (QC) inspection of the wafer is carried out to determine if there is any visual defects or contamination. In general, the wafer is ready for shipment after passing the quality control inspection.

In step S112, a series of wafer sort tests on the wafer products is carried out. The wafer sort test including, for example, a memory cell retention check is carried out within a testing plant. The memory cell retention check includes, for example, heating the wafer to a temperature of about 250° C. and maintaining the wafer at that temperature for a 24-hour period. In the meantime, a high voltage is applied to perform a programming operation.

Figure 2:
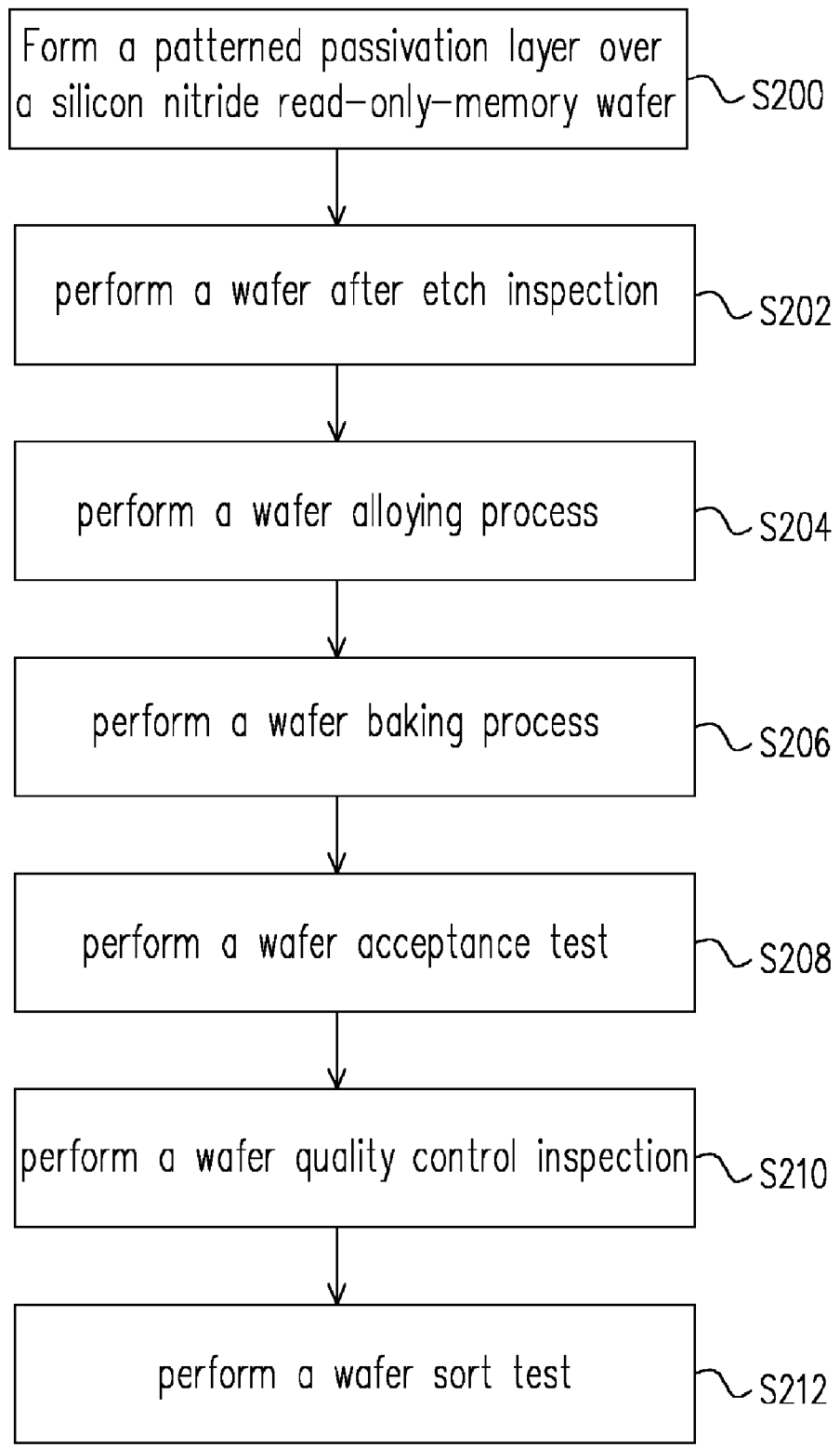
FIG. 2 is a flow chart showing the steps for increasing cell retention capacity of a silicon nitride read-only-memory cell according to a second preferred embodiment of this invention.

FIG. 2 is a flow chart showing the steps for increasing cell retention capacity of a silicon nitride read-only-memory cell according to a second preferred embodiment of this invention. The second embodiment differs from the first embodiment in that the baking process is carried out after the alloying process but before the wafer acceptance test. The steps for increasing the cell retention capacity of a silicon nitride read-only-memory are described in the following.

First, a patterned passivation layer is formed over a silicon nitride read-only-memory wafer (step S200). An after etch inspection of the patterned passivation layer is carried out (step S202). Thereafter, an alloying of the wafer is carried out (step S204) and then the wafer is baked to remove the trapped holes within the tunnel oxide layer (step S206). Afterwards, a wafer acceptance test is performed (step S208) and then a quality control inspection of the wafer is carried out (step S210). Finally, a series of wafer sort tests (step S212) is performed to sort out the wafer products.

Figure 3:
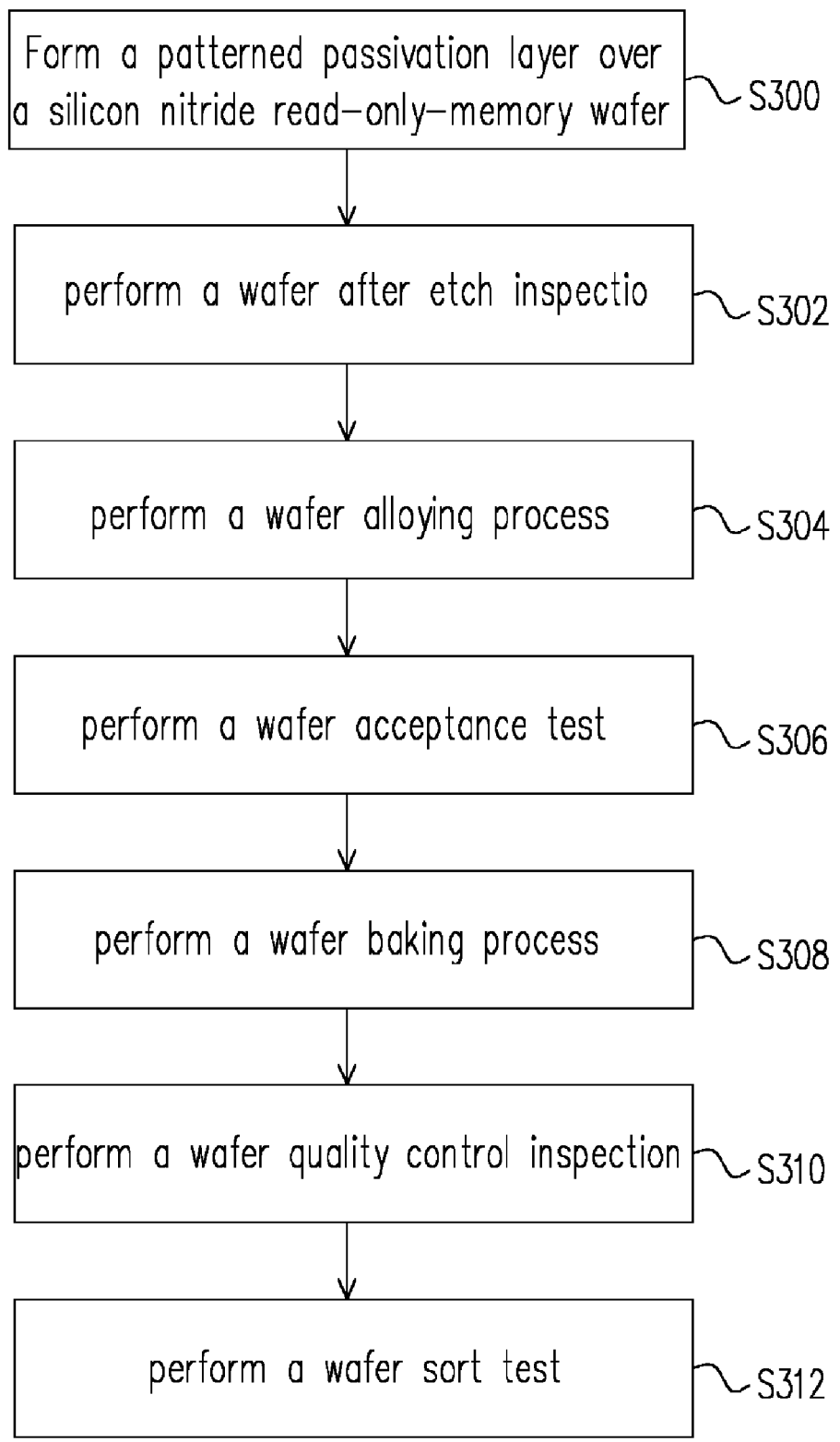
FIG. 3 is a flow chart showing the steps for increasing cell retention capacity of a silicon nitride read-only-memory cell according to a third preferred embodiment of this invention.

Aside from the first and the second embodiments, a third method for increasing the memory retention capacity of silicon nitride read-only-memory is possible. FIG. 3 is a flow chart showing the steps for increasing cell retention capacity of a silicon nitride read-only-memory cell according to a third preferred embodiment of this invention. One major difference between the third embodiment and the previous two embodiments is that the baking process is carried out after the wafer acceptance test but before the wafer sorting tests. The steps for increasing the cell retention capacity of a silicon nitride read-only-memory are described in the following.

First, a patterned passivation layer is formed over a silicon nitride read-only-memory wafer (step S300). An after etch inspection of the patterned passivation layer is carried out (step S302). Thereafter, an alloying of the wafer is carried out (step S304) and then a wafer acceptance test is performed (step S306). The wafer is baked to remove the trapped holes within the tunnel oxide layer (step S308). Afterwards, a quality control inspection of the wafer is carried out (step S310). Finally, a series of wafer sort tests (step S312) is performed to sort out the wafer products.

Furthermore, the baking process in the third embodiment can be carried out after the quality control inspection but before the wafer sort tests.

In the aforementioned steps S104, S206 and S308, baking the wafers at a temperature above 170° C. for 8 hours is able to remove the holes trapped within the tunnel oxide layer. In general, there is no specific rule to observe in the baking process and hence the baking temperature and time can be varied according to demand. Furthermore, the heating devices can be various types of furnaces or burn in oven. Alternatively, ultraviolet light can be used to heat up the wafers. In addition, the same heating device for carrying out the cell retention check can also be used for heating the wafer in the baking process.

In the aforementioned embodiments, the baking process is carried out after the after etch inspection but before the alloying process, or after the alloying process but before the wafer acceptance test, or after the wafer acceptance test but before the quality control inspection, or after the quality control inspection but before the wafer sort tests. However, this invention is not limited as such. In practice, the main cause for holes to trap inside the tunnel oxide layer is the plasma treatment. Therefore, performing a baking process anywhere after the last plasma treatment of the wafer (in the embodiment of this invention, the dry etching of the photoresist material in steps 100, 200 and 300) but before the wafer sort tests should be included within the scope of this invention.

Figure 4:
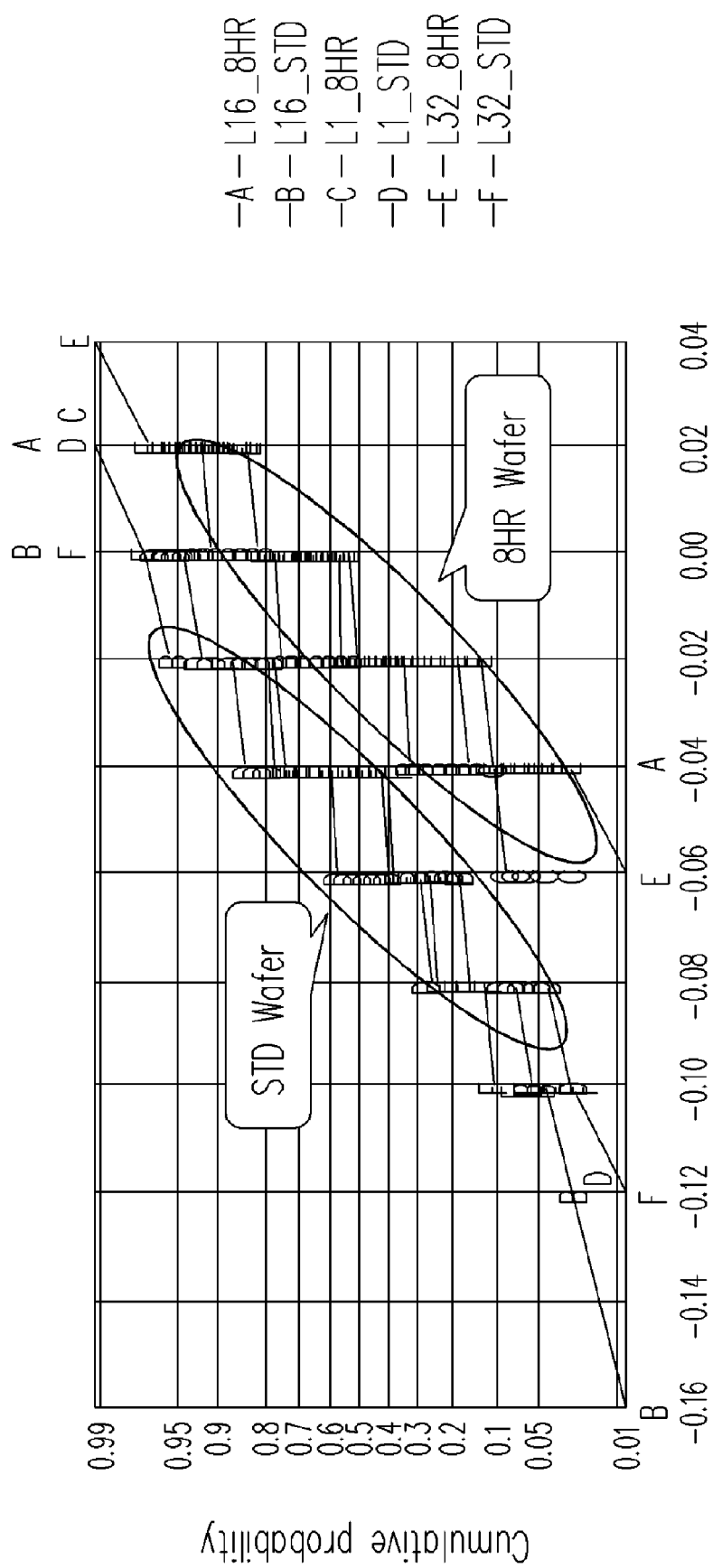
FIG. 4 is a diagram showing the bias voltage characteristic between a finished wafer product with an 8-hours pre-baking and a finished wafer product with a conventional retention check.

FIG. 4 is a diagram showing the threshold voltage shifted characteristic between a finished wafer product with an 8-hours pre-baking and a finished wafer product with a conventional retention check. In FIG. 4, two outermost word lines (L1 and L32) as well as a central word line L16 within the memory cell array of a finished wafer product with 8-hour pre-baking is compared with the same word lines of a standard finished wafer product (without baking). The vertical axis is the cumulative probability. The letter A represents a word line in a central location with 8-hour baking, the letter B represents a word line in a central location without baking, the letters C & E represent two word lines on each side with 8-hour baking, the letters D & F represents two word lines on each side without baking. According to the results shown in FIG. 4, the bias voltage of the word lines C, E on each side of the wafer with 8-hour baking is considerably bigger than the bias voltage of the word lines D, F on each side of the wafer without baking.

The results in FIG. 4 shows that baking is able to maintain an almost constant threshold voltage between the word lines on each side of a finished wafer product and the word lines in a central location. That is, the baking process according to this invention is able to limit the loss of charges from the charge-trapping layer to a minimum and improves the charge retention capacity of the wafer product (the silicon nitride read-only-memory).

In summary, one major characteristic of the invention of the wafer is the execution of a baking process at a preset temperature for a pre-determined period after performing the wafer acceptance test but before the wafer sort tests. The baking process eliminates any charges trapped inside the tunnel oxide layer within the silicon nitride read-only-memory.

Furthermore, the removal of trapped holes from the tunnel oxide layer of the wafer prevents any substantial loss of charges from the charge-trapping layer or even if a cell retention check is subsequently carried out. Ultimately, there is very little drop in the threshold voltage of the memory cell and the charge retention capacity of the wafer (with silicon nitride read-only-memory therein) is greatly improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A method of increasing a cell retention capacity of a silicon nitride read-only-memory, wherein the silicon nitride read-only-memory is formed inside a wafer, the method comprising the step of:
    performing a plasma treatment to the wafer, wherein the plasma treatment is last plasma treatment of the wafer;
    baking the wafer; and
    performing a wafer sort test.

2. The method of claim 1, wherein after performing the last plasma treatment of the wafer but before performing the wafer sort test, furthermore comprises performing an after etch inspection, an alloying process, a wafer acceptance test and a quality control inspection.

3. The method of claim 2, wherein the baking process is carried out after performing the after etch inspection but before the alloying process.

4. The method of claim 2, wherein the baking process is carried out after performing the alloying process but before the wafer acceptance test.

5. The method of claim 2, wherein the baking process is carried out after performing the wafer acceptance test but before the quality control inspection.

6. The method of claim 2, wherein the baking process is carried out after performing the quality control inspection but before the wafer sort test.

7. The method of claim 1, wherein the wafer sort test comprises a memory cell retention check.

8. The method of claim 7, wherein the baking process is carried out using a heating device the same to that for performing the memory cell retention check.

9. A method far increasing a cell retention capacity of a silicon nitride read-only-memory formed on a wafer, the method comprising the steps of:
    forming a passivation layer and a patterned photoresist layer over the wafer;
    etching away a portion of the passivation layer using the patterned photoresist layer as a mask;
    removing the patterned photoresist layer;
    performing an after etch inspection;
    performing an alloying process;
    performing a wafer acceptance test;
    performing a quality control inspection; and
    performing a wafer sort test;
    wherein one major aspect of the method is to perform the baking process after removing the patterned photoresist layer but before the wafer sort test.

10. The method of claim 9, wherein the patterned photoresist layer is removed by performing a plasma dry etching.

11. The method of claim 9, Wherein the baking process is carried out after performing the after etch inspection but before the alloying process.

12. The method of claim 9, wherein the baking process is carried out after performing the alloying process but before the wafer acceptance test.

13. The method of claim 9, wherein the baking process is carried out after performing the wafer acceptance test but before the quality control inspection.

14. The method of claim 9, wherein the baking process is carried out after performing the quality control inspection but before the wafer sort test.

15. The method of claim 9, wherein the wafer sort test comprises a memory cell retention check.

16. The method of claim 15, wherein the baking process is carried out using a heating device the same to that for performing the memory cell retention check.

* * * * *